(12) United States Patent
Cho et al.

(10) Patent No.: US 6,460,609 B1
(45) Date of Patent: Oct. 8, 2002

(54) HEAT SINK FOR FACILITATING AIR FLOW

(75) Inventors: Tung Min Cho, Taipei (TW); Yom Wu; Hongxia Li, both of Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/915,785

(22) Filed: Jul. 26, 2001

(30) Foreign Application Priority Data

Jun. 20, 2001 (TW) ..................................... 090210382 U

(51) Int. Cl.⁷ ................................................ H05K 7/20
(52) U.S. Cl. ..................... 165/80.3; 165/185; 257/722; 361/697
(58) Field of Search ............................. 165/80.3, 185; 174/16.3; 361/697, 704, 710; 257/722

(56) References Cited

U.S. PATENT DOCUMENTS

| | | | | |
|---|---|---|---|---|
| 5,132,780 A | * | 7/1992 | Higgins, III | 165/104.34 |
| 5,583,316 A | * | 12/1996 | Kitahara et al. | 174/16.3 |
| 5,734,552 A | * | 3/1998 | Krein | 165/80.3 |
| 6,035,513 A | * | 3/2000 | Batten, Jr. et al. | 29/450 |

FOREIGN PATENT DOCUMENTS

| | | | | | |
|---|---|---|---|---|---|
| JP | 1-140749 A | * | 6/1989 | | 257/722 |
| JP | 5-29504 A | * | 2/1993 | | 257/722 |
| JP | 2001111276 A | * | 4/2001 | | H05K/7/20 |

* cited by examiner

*Primary Examiner*—Allen Flanigan
(74) *Attorney, Agent, or Firm*—Wei Te Chung

(57) ABSTRACT

A heat sink (20) includes a chassis (23), and a plurality of fins (25) extending upwardly from the chassis. The chassis includes a platform (27) and a guide portion (29) extending horizontally from. an end portion of the platform. The guide portion has top and bottom surfaces. At least one of the top and bottom surfaces is arcuate such that the guide portion tapers toward a distal end. When a fan system operates at a side of the heat sink generally facing the guide portion, the guide portion guides cooling air generated from the fan to top and bottom surfaces of the chassis and to bottom portions of the fins, whereupon the cooling air exits the heat sink. Heat accumulating on the chassis and the bottom portions of the fins is thereby efficiently removed.

12 Claims, 8 Drawing Sheets

| Sample | Flow speed M/S | Power Watt | Tamb °C | Tj °C | ΔT °C | θ °C/W |
|---|---|---|---|---|---|---|
| | 1.5 | | | 65.5 | 45.5 | 1.1343 |
| | 2.0 | 40.112 | 20.0 | 61.3 | 41.3 | 1.0296 |
| | 3.0 | | | 54.6 | 34.6 | 0.8626 |
| | 1.5 | | | 61.6 | 41.6 | 1.0371 |
| | 2.0 | 40.112 | 20.0 | 56.5 | 36.5 | 0.9099 |
| | 3.0 | | | 50.2 | 30.2 | 0.7529 |
| | 1.5 | | | 61.6 | 41.6 | 1.0371 |
| | 2.0 | 40.112 | 20.0 | 57.3 | 37.3 | 0.9299 |
| | 3.0 | | | 50.3 | 30.3 | 0.7554 |
| | 1.5 | | | 61.1 | 61.3 | 1.0246 |
| | 2.0 | 40.112 | 20.0 | 56.6 | 36.6 | 0.9146 |
| | 3.0 | | | 49.7 | 29.7 | 0.7404 |

FIG. 8

HEAT SINK FOR FACILITATING AIR FLOW

BACKGROUND OF THE INVENTION

1. Field of the Invention

The present invention relates to heat sinks used in conjunction with cooling fans, and more particularly to heat sinks which facilitate flow of cooling air received from cooling fans.

2. Description of Prior Art

Modem electronic devices in a computer can operate at very high speeds. The faster an electronic device operates, the more heat it generates. Excessive heat can make the electronic device unstable, or even cause damage to the electronic device or associated components in the computer. Therefore, heat must be removed efficiently to ensure normal operation. Typically, an extruded heat sink is mounted on a top surface of the electronic device. A fan system is commonly used to facilitate heat removal by way of convection.

A conventional extruded heat sink 1 is shown in FIG. 6. The heat sink 1 comprises a rectangular chassis 11, and a plurality of fins 12 extending vertically upwardly from the chassis 11. Experiments have demonstrated that the heat sink 1 has a highest efficiency of heat removal when the thickness of the chassis 11 is in the range of 8 to 10 millimeters.

When a fan system operates at a side of the heat sink I to facilitate heat removal, a vertical side surface of the chassis 11 blocks a flow of a lower portion of cooling air generated from the fan. The cooling air moves upwardly and away from the chassis 11 and bottom portions of the fins 12 (see FIG. 7). As a result, the heat accumulating on the chassis 11 and on the bottom portions of the fins 12 cannot be speedily removed. This seriously reduces the efficiency of heat removal from the electronic device.

Thus, an improved heat sink which overcomes the above-mentioned problems is strongly desired.

SUMMARY OF THE INVENTION

Accordingly, an object of the present invention is to provide a heat sink wherein cooling air from a fan system efficiently flows through and around the heat sink.

In order to achieve the object set out above, a heat sink of the present invention comprises a chassis and a plurality of fins extending upwardly from the chassis. The chassis includes a platform and a guide portion extending horizontally from an end portion of the platform. The guide portion has top and bottom surfaces. At least one of the top and bottom surfaces is arcuate such that the guide portion tapers toward a distal end. When a fan system operates at a side of the heat sink generally facing the guide portion, the guide portion guides cooling air generated from the fan to top and bottom surfaces of the chassis and to bottom portions of the fins, whereupon the cooling air exits the heat sink. Heat accumulating on the chassis and the bottom portions of the fins is thereby efficiently removed.

Other objects, advantages and novel features of the present invention will become more apparent from the following detailed description when taken in conjunction with the accompanying drawings.

BRIEF DESCRIPTION OF THE DRAWINGS

FIG. 8 is a table of temperature data obtained from laboratory tests of the conventional heat sink and heat sinks of the present invention.

DETAILED DESCRIPTION OF THE INVENTION

Figure 1:
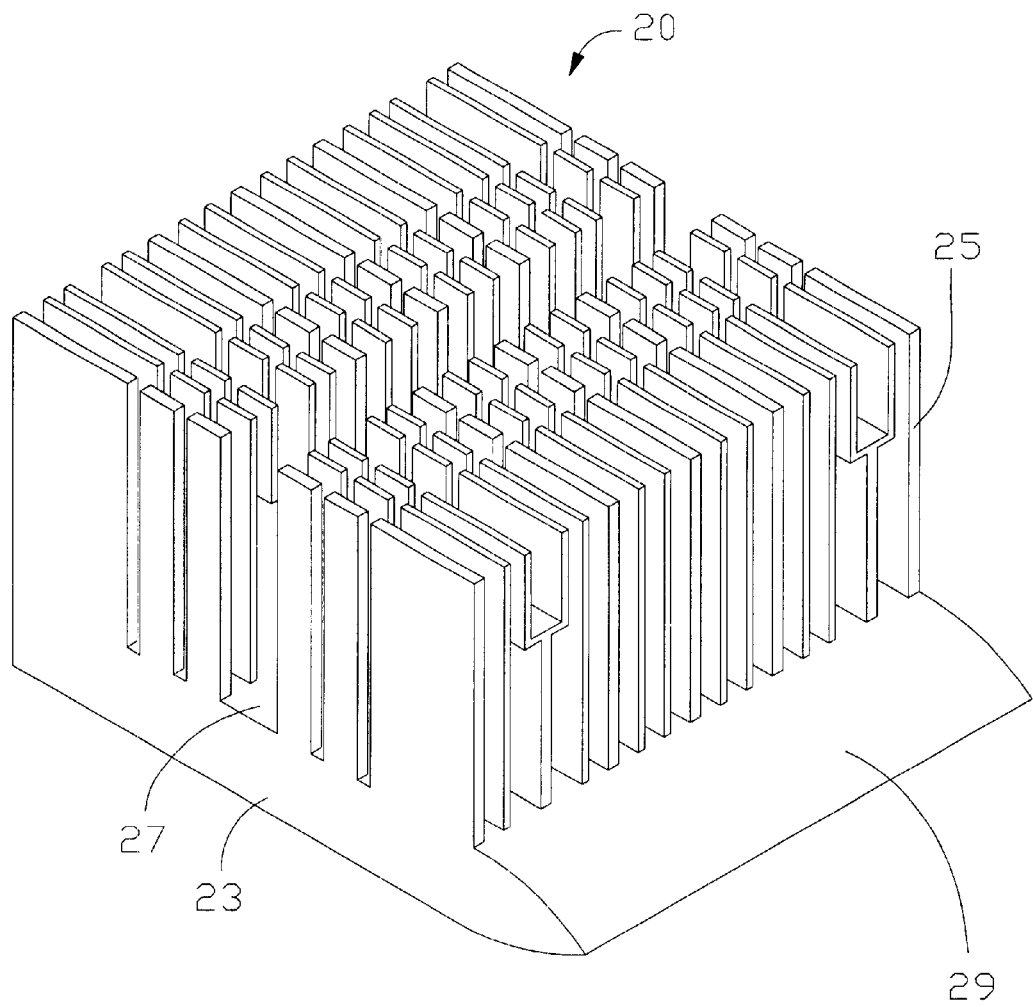
FIG. 1 is a perspective view of a heat sink in accordance with a preferred embodiment of the present invention.

Reference will now be made to the drawing figures to describe several embodiments of the present invention in detail.

Figure 2:
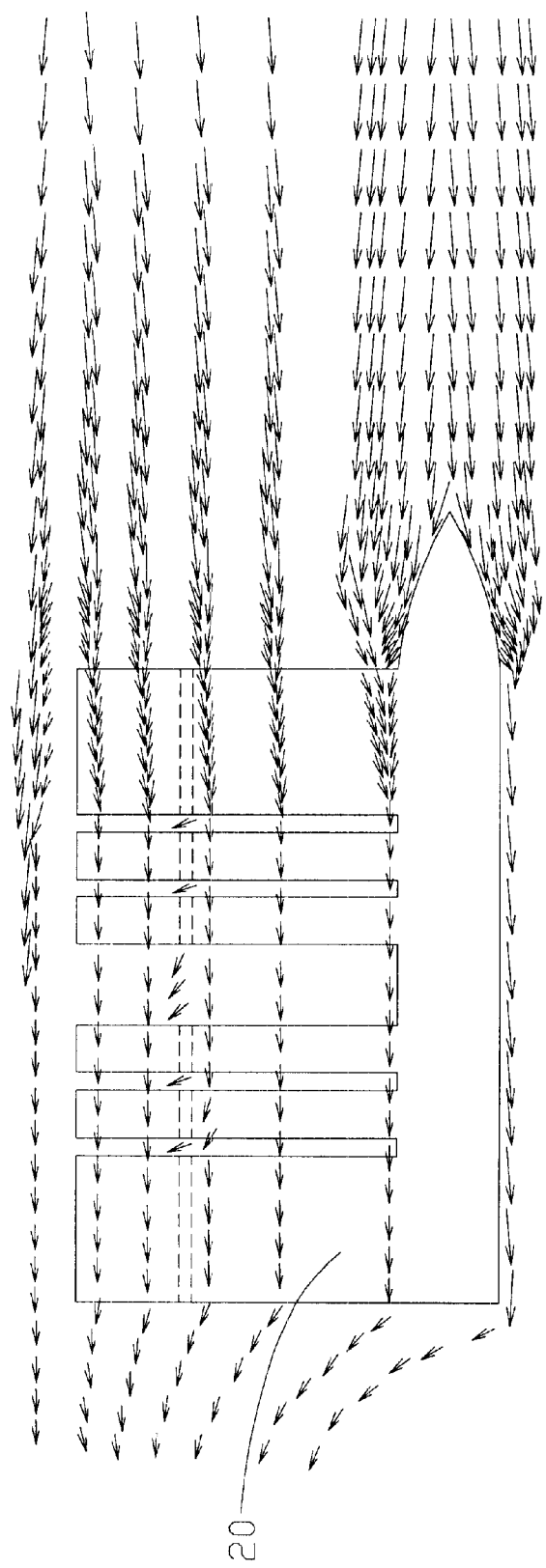
FIG. 2 is a schematic side view of the heat sink of FIG. 1, showing flow of cooling air.

Referring to FIGS. 1–2, a heat sink 20 in accordance with the preferred embodiment of the present invention comprises a chassis 23 and a plurality of fins 25. The fins 25 extend vertically upwardly from a top surface of the chassis 23. The chassis 23 comprises a platform 27, and a guide portion 29 extending horizontally from an end portion of the platform 27. The guide portion 29 has top and bottom convex arcuate surfaces, such that it tapers toward a distal end.

When a fan system operates at a side of the heat sink 20 generally facing the guide portion 29, the guide portion 29 guides cooling air generated from the fan to top and bottom surfaces of the chassis 23 and to bottom portions of the fins 25. As a result, a large amount of cooling air reaches the chassis 23 and the bottom portions of the fins 25 before exiting the heat sink 20 (See FIG. 2). Thus, heat accumulating on the chassis 23 and the bottom portions of the fins 25 is efficiently removed.

Figure 3:
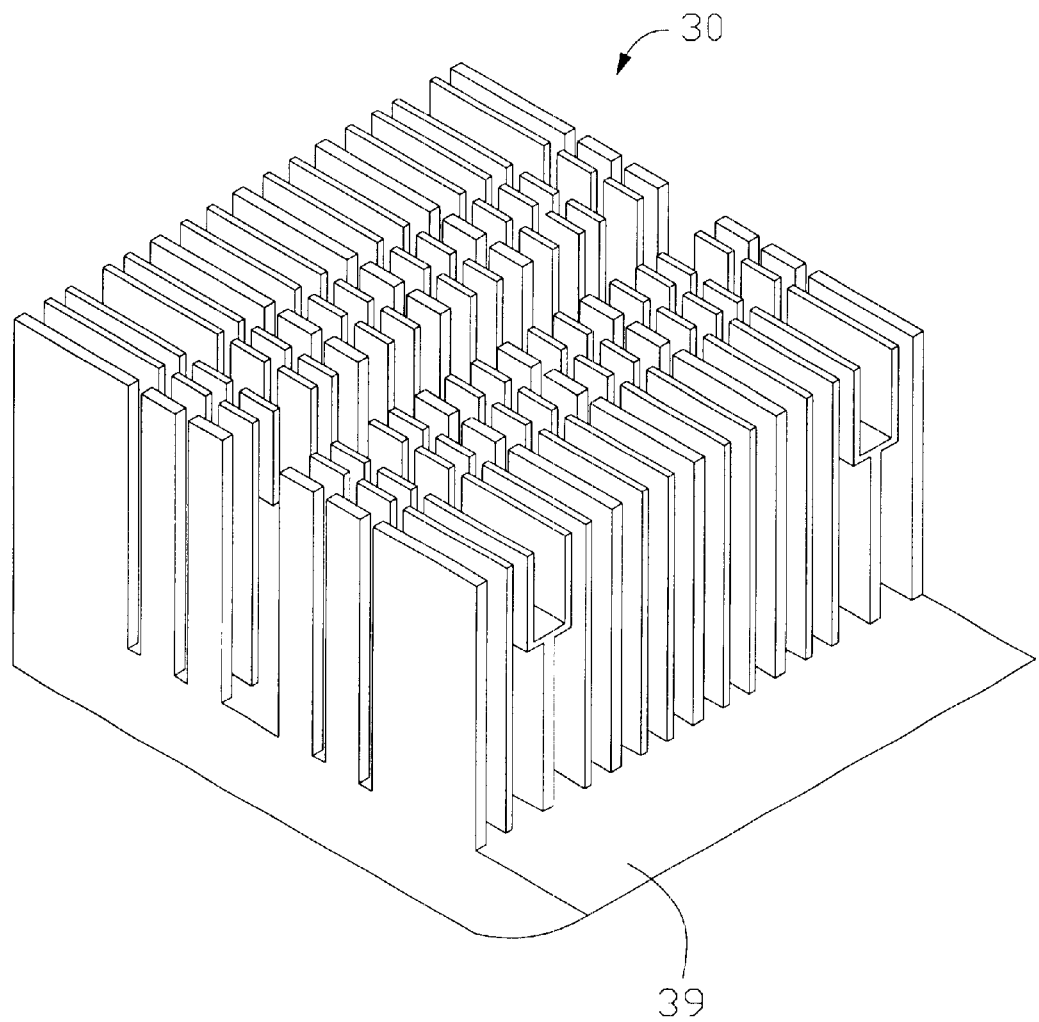
FIG. 3 is a perspective view of a heat sink in accordance with an alternative embodiment of the present invention.

FIG. 3 shows a heat sink 30 with a guide portion 39 in accordance with an alternative embodiment of the present invention. The heat sink 30 is similar to the heat sink 20. However, the guide portion 39 of the heat sink 30 has a flat top surface and an arcuate bottom surface.

Figure 4:
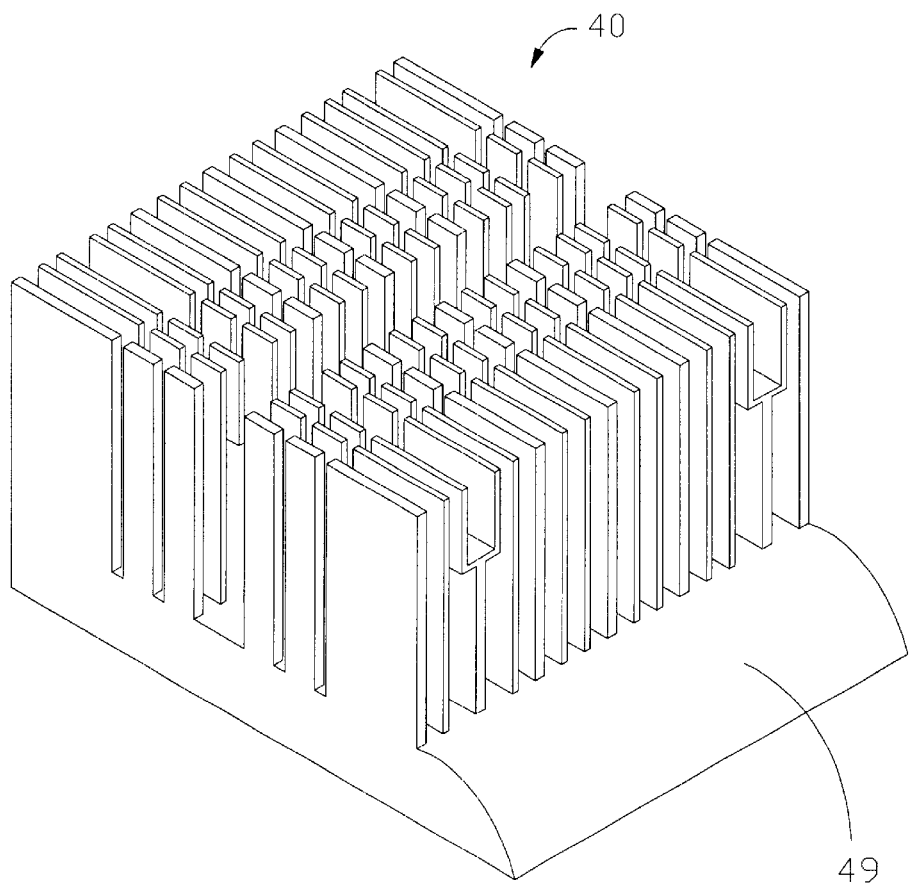
FIG. 4 is a perspective view of a heat sink in accordance with a further alternative embodiment of the present invention.

FIG. 4 shows a heat sink 40 with a guide portion 49 in accordance with a further alternative embodiment of the present invention. The heat sink 40 is similar to the heat sink 20. However, the guide portion 49 of the heat sink 40 has an arcuate top surface and a flat bottom surface.

Figure 5:
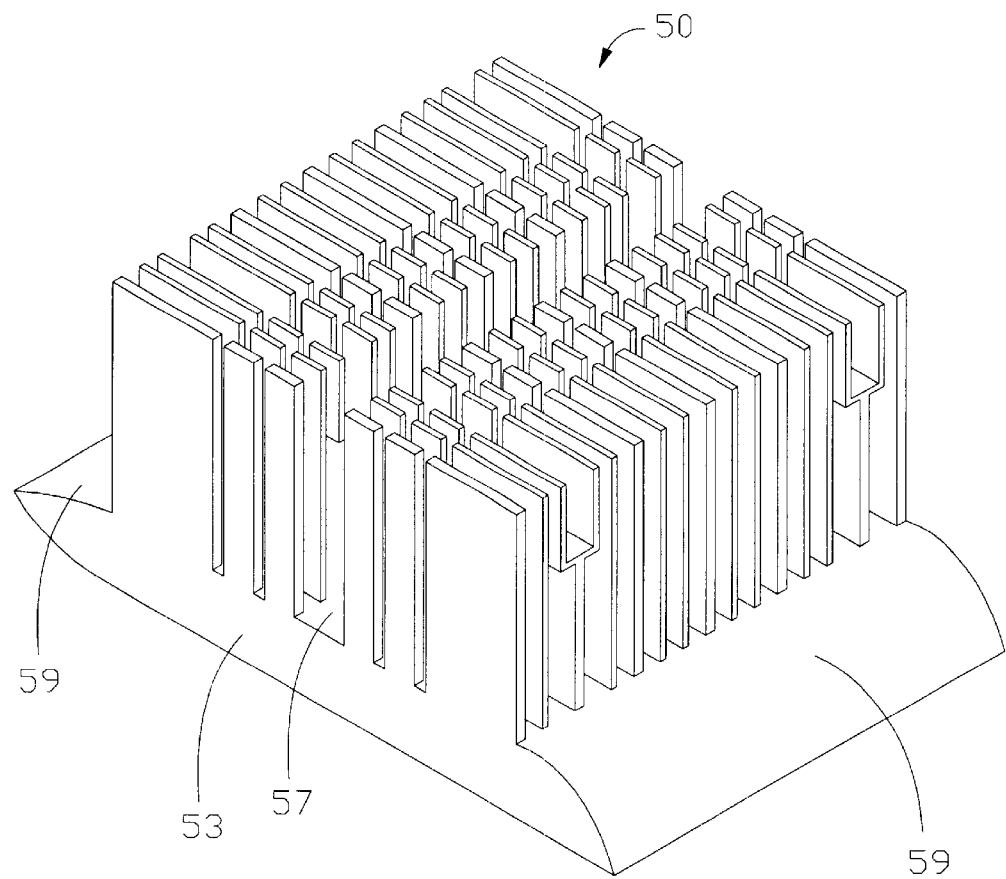
FIG. 5 is a perspective view of a heat sink in accordance with a still further alternative embodiment of the present invention.
Figure 6:
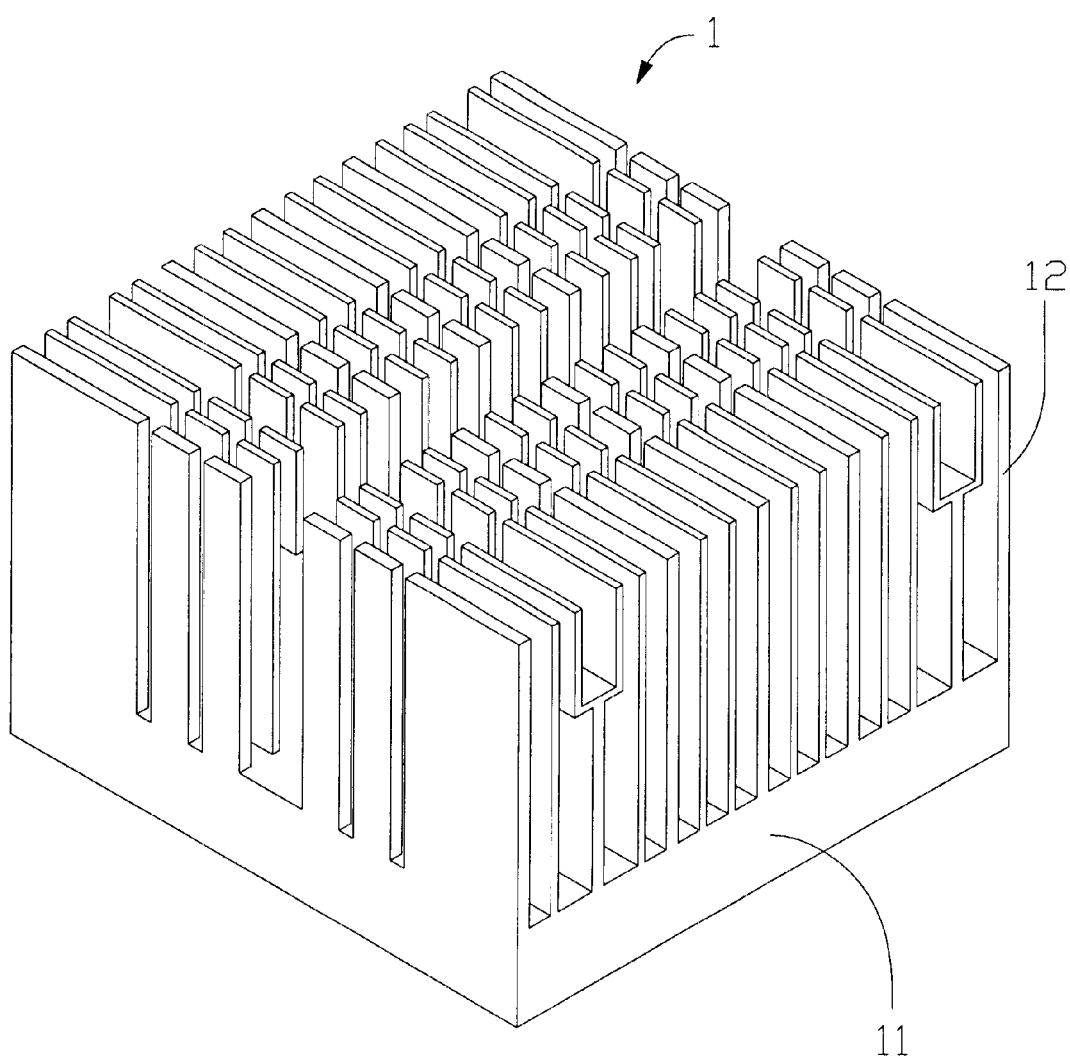
FIG. 6 is a perspective view of a conventional heat sink.
Figure 7:
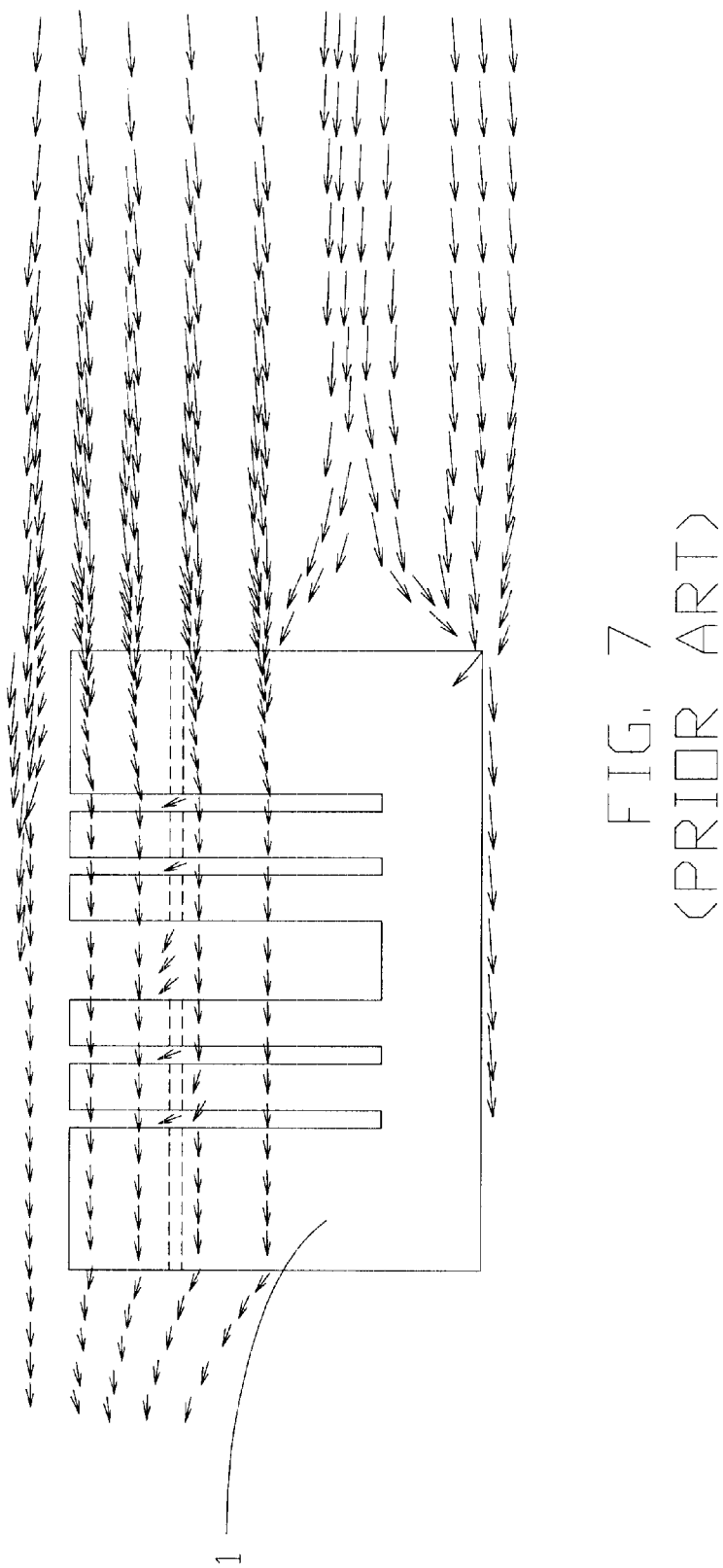
FIG. 7 is a schematic side view of the heat sink of FIG. 6, showing flow of cooling air.

FIG. 5 shows a heat sink 50 with a pair of guide portions 59 in accordance with a still further alternative embodiment of the present invention. The heat sink 50 is similar to the heat sink 20. However, a chassis 53 of the heat sink 50 comprises two guide portions 59 extending from respective opposite ends of a platform 57 of the heat sink 50. The guide portion 59 at a windward end of the heat sink 50 is similar to the guide portion 49 of the heat sink 40 of the further alternative embodiment of the present invention. The guide portion 59 at a leeward end of the heat sink 50 is similar to the guide portion 29 of the heat sink 20 of the preferred embodiment of the present invention.

It will be readily appreciated by those skilled in the art that various permutations and combinations of the guide portions 59 of the heat sink 50 are possible. Each guide portion 59 can be similar to any guide portion 29, 39 or 49 of the heat sinks 20, 30 or 40 of the preferred, alternative, or further alternative embodiments of the present invention.

Any guide portion 29, 39, 49 or 59 of any of the heat sinks 20, 30, 40, or 50 of the present invention can be integrally formed with the corresponding heat sink 20, 30, 40, or 50. Alternatively, any guide portion 29, 39, 49 or 59 can be a separate component secured to the corresponding end portion of the platform of each heat sink 20, 30, 40, or 50. Such separate component can, for example, be a cover such as a plastic cover. The cover may be hollow, solid, or of other suitable configuration.

FIG. 8 is a table of temperature data obtained from laboratory tests of the conventional heat sink 1 and the heat sinks 40, 20 and 50 of the present invention, in that order. The tests were conducted with the environmental temperature being 20° C., the power of the heat-generating element being 40.112 watt, and the air flow speeds being respectively 1.5 m/s, 2.0 m/s, and 3.0 m/s. The data shows that heat resistance θ of the heat sinks 40, 20 and 50 of the present invention was always lower than heat resistance θ of the conventional heat sink 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink adapted to facilitate flow of cooling air from a fan system operating at a side of the heat sink, the heat sink comprising:
   a chassis comprising a platform, and at least one guide portion extending horizontally from the platform, the at least one guide portion having top and bottom surfaces, at least one of the top and bottom surfaces of the at least one guide portion being arcuate such that the guide portion tapers; and
   a plurality of fins extending upwardly from the platform;
   wherein the at least one guide portion guides cooling air to top and bottom surfaces of the chassis and bottom portions of the fins.

2. The heat sink in accordance with claim 1, wherein both the top and bottom surfaces of the at least one guide portion are arcuate.

3. The heat sink in accordance with claim 1, wherein the top surface of the at least guide portion is flat and the bottom surface of the at least one guide portion is arcuate.

4. The heat sink in accordance with claim 1, wherein the top surface of the at least one guide portion is arcuate and the bottom surface of the at least one guide portion is flat.

5. The heat sink in accordance with claim 1, wherein there are two said guide portions extending from opposite ends of the platform of the chassis.

6. The heat sink in accordance with claim 1, wherein the at least one guide portion is integrally formed with the chassis.

7. The heat sink in accordance with claim 1, wherein the at least guide portion is a cover secured to an end of the platform.

8. The heat sink in accordance with claim 7, wherein the cover is plastic.

9. A heat sink comprising:
   a chassis comprising a platform adapted for engaging with a heat-generating electronic device, and a guide portion connecting to an end of the platform, the guide portion having a bottom surface tapered in a first direction extending toward a distal end of the guide portion distant from the platform; and
   a plurality of fins extending upwardly from the platform said fins being generally aligned with, and presenting a low aerodynamic profile with respect to, a crossflow direction which is substantially parallel to said first direction.

10. The heat sink in accordance with claim 9, wherein the guide portion is integrally formed with the platform.

11. The heat sink in accordance with claim 9, wherein the guide portion is formed separately from the platform.

12. A heat sink comprising:
   a chassis comprising a platform adapted for engaging with a heat-generating electronic device, and a guide portion connecting to an end of the platform, the guide portion having top and bottom surfaces both tapered in a first direction extending toward a distal end of the guide portion distant from the platform; and
   a plurality of fins extending upwardly from the platform, said fins being generally aligned with, and presenting a low aerodynamic profile with respect to, a crossflow direction which is substantially parallel to said first direction.

* * * * *